(12) United States Patent
Rathmell et al.

(10) Patent No.: US 7,361,914 B2
(45) Date of Patent: Apr. 22, 2008

(54) MEANS TO ESTABLISH ORIENTATION OF ION BEAM TO WAFER AND CORRECT ANGLE ERRORS

(75) Inventors: Robert D. Rathmell, Murphy, TX (US); Bo H. Vanderberg, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 204 days.

(21) Appl. No.: 11/290,344

(22) Filed: Nov. 30, 2005

(65) Prior Publication Data

US 2007/0120067 A1    May 31, 2007

(51) Int. Cl.
*G21K 5/10* (2006.01)
*H01J 37/08* (2006.01)

(52) U.S. Cl. ............... 250/492.21; 250/396; 250/397; 250/492.2; 250/398; 250/492.3

(58) Field of Classification Search ........... 250/397, 250/396, 492.21, 492.2, 398, 492.3
See application file for complete search history.

(56) References Cited

U.S. PATENT DOCUMENTS

| | | | |
|---|---|---|---|
| 5,583,427 A | 12/1996 | Teruya et al. | |
| 6,437,350 B1 * | 8/2002 | Olson et al. | 250/492.21 |
| 6,690,022 B2 | 2/2004 | Larsen et al. | |
| 6,828,527 B2 | 12/2004 | Simic-Glavaski et al. | |
| 6,852,984 B2 * | 2/2005 | Krueger | 250/397 |
| 2003/0094583 A1 | 5/2003 | Jang et al. | |
| 2003/0197132 A1 | 10/2003 | Keum et al. | |

FOREIGN PATENT DOCUMENTS

| | | |
|---|---|---|
| EP | 0 975 004 A2 | 1/2000 |
| GB | 2 355 337 A | 4/2001 |
| WO | WO 02/058103 A2 | 7/2002 |

OTHER PUBLICATIONS

International Search Report, Int'l Application No. PCT/US2006/044891, Int'l Filing Data Nov. 17, 2006, 3 pgs.

* cited by examiner

*Primary Examiner*—Jack I. Berman
*Assistant Examiner*—Meenakshi S Sahu
(74) *Attorney, Agent, or Firm*—Eschweiler & Associates, LLC (57) ABSTRACT

One or more aspects of the present invention pertain to a measurement component that facilitates determining a relative orientation between an ion beam and a workpiece. The measurement component is sensitive to ion radiation and allows a relative orientation between the measurement component and the ion beam to be accurately determined by moving the measurement component relative to the ion beam. The measurement component is oriented at a known relationship relative to the workpiece so that a relative orientation between the workpiece and beam can be established. Knowing the relative orientation between the ion beam and workpiece allows the workpiece to be oriented to a specific angle relative to the measured beam angle for more accurate and precise doping of the workpiece, which enhances semiconductor fabrication.

18 Claims, 7 Drawing Sheets

MEANS TO ESTABLISH ORIENTATION OF ION BEAM TO WAFER AND CORRECT ANGLE ERRORS

FIELD OF THE INVENTION

The present invention relates generally to ion implantation systems, and more particularly to a mechanism configured to establish an orientation of an ion beam to a workpiece and correct angle errors.

BACKGROUND OF THE INVENTION

Ion implantation systems are the mechanisms utilized to dope semiconductor substrates with dopants or impurities in integrated circuit manufacturing. In such systems, a dopant material is ionized and an ion beam is generated there-from. The ion beam is directed at the surface of a semiconductor wafer in order to implant the wafer with the dopant element. The ions of the beam penetrate the surface of the wafer to form a region of desired conductivity, such as in the fabrication of transistor devices in the wafer. A typical ion implanter includes an ion source for generating the ion beam, a beamline assembly including a mass analysis apparatus for directing and/or filtering (e.g., mass resolving) the ions within the beam using magnetic fields, and a target chamber containing one or more semiconductor wafers or workpieces to be implanted by the ion beam.

Ion implanters are advantageous because they allow for precision with regard to both quantity and placement of dopant within the silicon. In order to achieve a desired implantation for a given application, the dosage and energy of the implanted ions may be varied. The ion dosage controls the concentration of implanted ions for a given semiconductor material. Typically, high current implanters are used for high dose implants, while medium current implanters are used for lower dosage applications. The ion energy is used to control junction depth in semiconductor devices, where the energy levels of the beam ions determine the degree to which ions are implanted or the depth of the implanted ions.

One commercially available ion implantation system uses an ion source that includes a source chamber spaced from an implantation chamber where one or more workpieces are treated by ions from the source. An exit opening in the source chamber allows ions to exit the source so they can be shaped, analyzed, and accelerated to form an ion beam. The ion beam is directed along an evacuated beam path to the ion implantation chamber where the ion beam strikes one or more workpieces, typically generally circular wafers. The energy of the ion beam is sufficient to cause ions that strike the wafers to penetrate those wafers in the implantation chamber. Such selective implantation thus allows an integrated circuit to be fabricated.

It can be appreciated that given the continuing trend in the electronics industry to scale down electronic devices to produce smaller, yet more powerful devices (e.g., cell phones, digital cameras, etc.) that can perform a greater number of increasingly complex functions with less power, that semiconductors and integrated circuits (e.g., transistors, etc.) utilized in these devices are continually reduced in size. The ability to "pack" more of these devices onto a single semiconductor substrate, or portion thereof (known as a die) also improves fabrication efficiency and yield. To increase packing densities, features formed in and on a wafer as part of the semiconductor fabrication process may be reduced in size. It can be appreciated that the accuracy with which dopants can be added to select locations of semiconductor substrates plays a critical role in successfully increasing packing densities. For example, there may be smaller margins for error with regard to implanting dopant ions within select locations of the semiconductor substrate given the reduced feature sizes. Accordingly, mechanisms and techniques that facilitate more accurate ion implantations are desirable.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

One or more aspects of the present invention pertain to a measurement component that facilitates determining a relative orientation between an ion beam and a workpiece into which ions are to be implanted by the ion beam. The measurement component is sensitive to ion radiation and allows a relative orientation between the measurement component and the ion beam to be accurately determined by moving the measurement component relative to the ion beam. The measurement component is oriented at a known relationship relative to the workpiece so that a relative orientation between the workpiece and beam can be established. Knowing the relative orientation between the ion beam and workpiece allows for more accurate and precise doping of the workpiece, which enhances semiconductor fabrication.

According to one or more aspects of the present invention, a device that assists with ion implantation is disclosed. The device includes a measurement component that is operatively associated with an endstation that is configured to position a workpiece relative to an ion beam so that ions traveling in the ion beam impact the workpiece at select locations. The measurement component facilitates determining a relative orientation between the ion beam and the workpiece, particularly by having a known orientation to the workpiece and detecting when the ion beam impinges upon the measurement component at a particular orientation.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

As alluded to above, in semiconductor fabrication processing, semiconductor wafers or workpieces are implanted with charged particles or ions. The ions exhibit desired electrical characteristics due to their net positive or negative electrical charges. When utilized in association with semiconductor processing, such ionized materials are referred to as dopants because they "dope" or alter the electrical characteristics of the base or other layers that they are implanted into, causing the layers to have desired and predictable electrical behavior.

Figure 1:
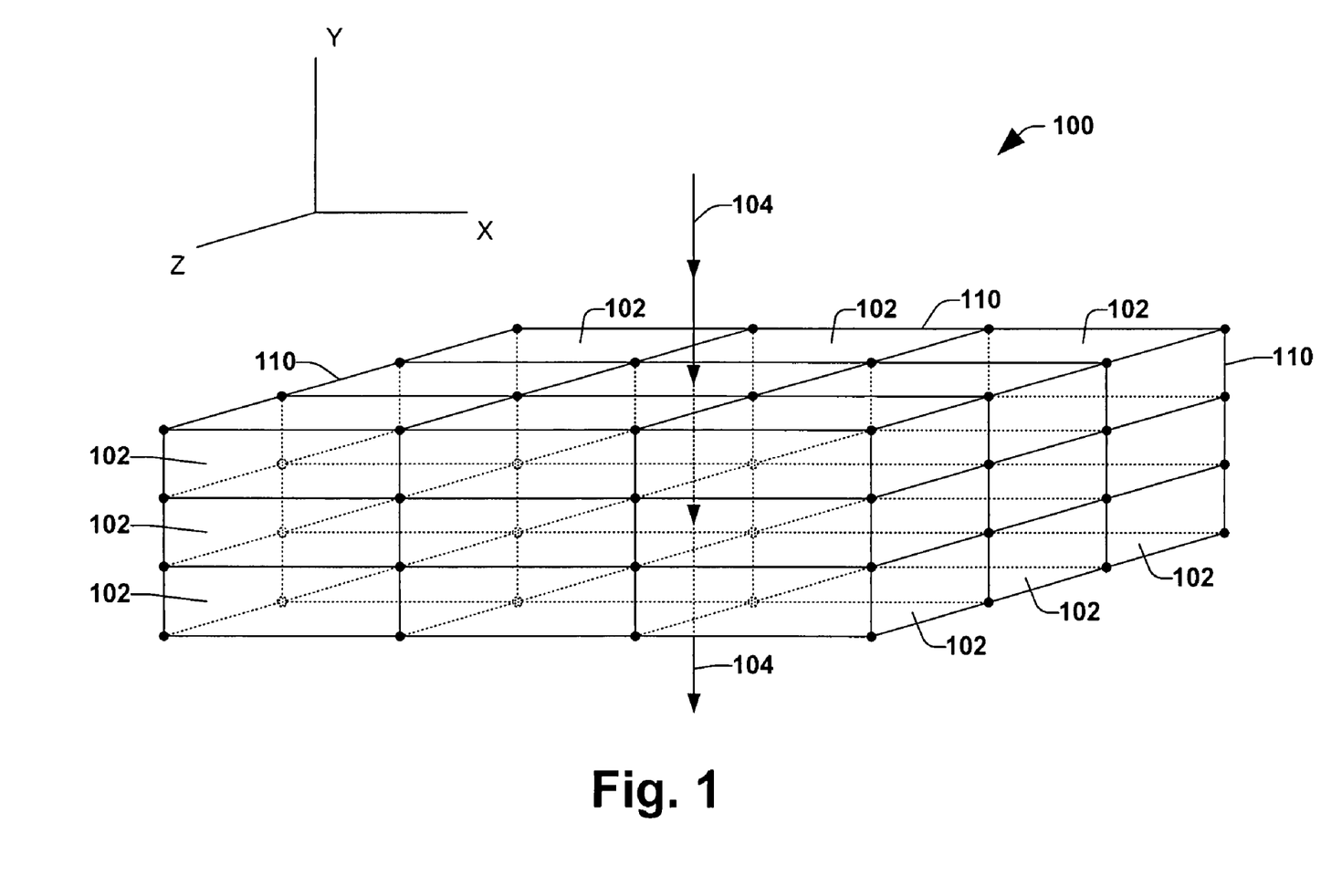
FIG. 1 is a perspective view of an example of a portion of a lattice structure wherein an ion beam is directed at the lattice structure substantially parallel to planes of the lattice structure.

The base layers or substrate are generally composed of silicon in a crystalline form. Materials are said to have a crystalline structure when their atoms are arranged in three dimensions in a regular manner, known as a crystalline lattice. By way of example, FIG. 1 illustrates a portion of a generic lattice structure 100 having a generally cubic configuration. In particular, in the example illustrated, the lattice structure 100 has twenty-seven (e.g., three by three by three) cells 102 that are generally cubical in shape. The lattice structure of the crystal exists within planes 110, and these planes 110 are substantially perpendicular to one another in the illustrated example (e.g., in the x, y, and z directions). It is to be appreciated, however, that lattice structures can come in any of a variety of different configurations and have any number of cells having any number of a variety of different shapes, such as diamond, pyramidal, hexagonal, etc.

The silicon base layers utilized in semiconductor fabrication are also referred to as wafers or substrates, at least in part, because they are cut from bulk silicon. In particular, very specific types of single crystals of silicon, known as boules, are grown into long lengths and thin slices (e.g., wafers) are cut there-from.

An important parameter of a semiconductor doping process is the angle of incidence between a beam of ions utilized to implant the dopant ions within the substrate and the internal lattice structure of the semiconductor material. The angle of incidence is important because it plays a role in a phenomenon known as channeling, among other things. In particular, as illustrated in FIG. 1, if the direction of the beam of dopant ions 104 is substantially parallel to (vertical) planes 110 of the lattice structure, the beam may pass there-through—with less energy loss per unit length, because ions moving in the space between the planes have fewer collisions with crystal atoms.

As such, the ions may, among other things, be implanted deeply within the substrate (e.g., within a central channel within FIG. 1). It can be appreciated that other aspects can also affect channeling, such as the degree of amorphization of the substrate, the atomic mass of the substrate and the mass and/or energy of ions within the beam, for example. For instance, the greater the energy of the ions within the beam 104, the more likely the ions may be implanted deeply into the substrate.

Figure 2:
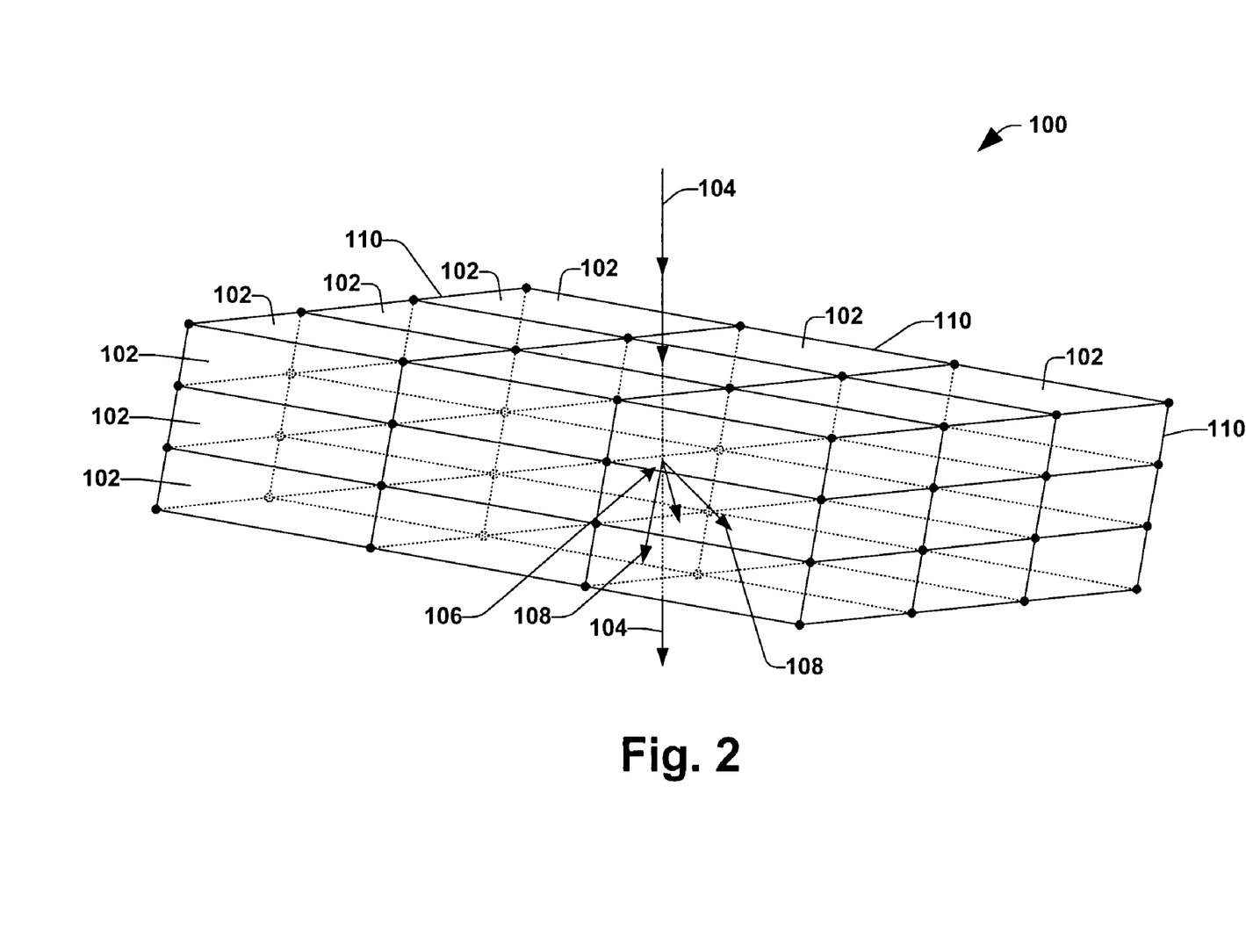
FIG. 2 is a perspective view of an example of a portion of a lattice structure, such as that depicted in FIG. 1, wherein an ion beam is directed at the lattice structure not substantially parallel to planes of the lattice structure.

In FIG. 2, for example, the direction of the beam 104 is not substantially parallel to (vertical) planes 110 of the lattice structure 100. As such, some of the ions within the ion beam 104 will likely impact portions 106 of the lattice structure and alter (e.g., damage) the lattice structure. In so doing, the ions will likely lose energy and slow down and/or be scattered from the original direction as indicated by arrows 108, thereby coming to rest in shallower portions of the workpiece. Accordingly, it may be desirable to orient the ion beam at a particular orientation relative to the lattice structure to mitigate channeling and/or localize doping.

In addition to channeling, shadowing effects also weigh in favor of developing a known implantation orientation. Shadowing generally results from the continuing trend in the electronics industry to scale down feature sizes to produce smaller, more powerful semiconductor devices. In certain instances, however, the spacings between features are reduced while the heights of the features may not be reduced. The generally fixed feature heights coupled with the shrinking spacings between features results in increased shadowing, whereby portions of the wafer that are to be doped receive little to no dopant ions. Such shadowing can become more exaggerated where an ion implantation angle is increased, such as to diminish channeling, for example.

Figure 3:
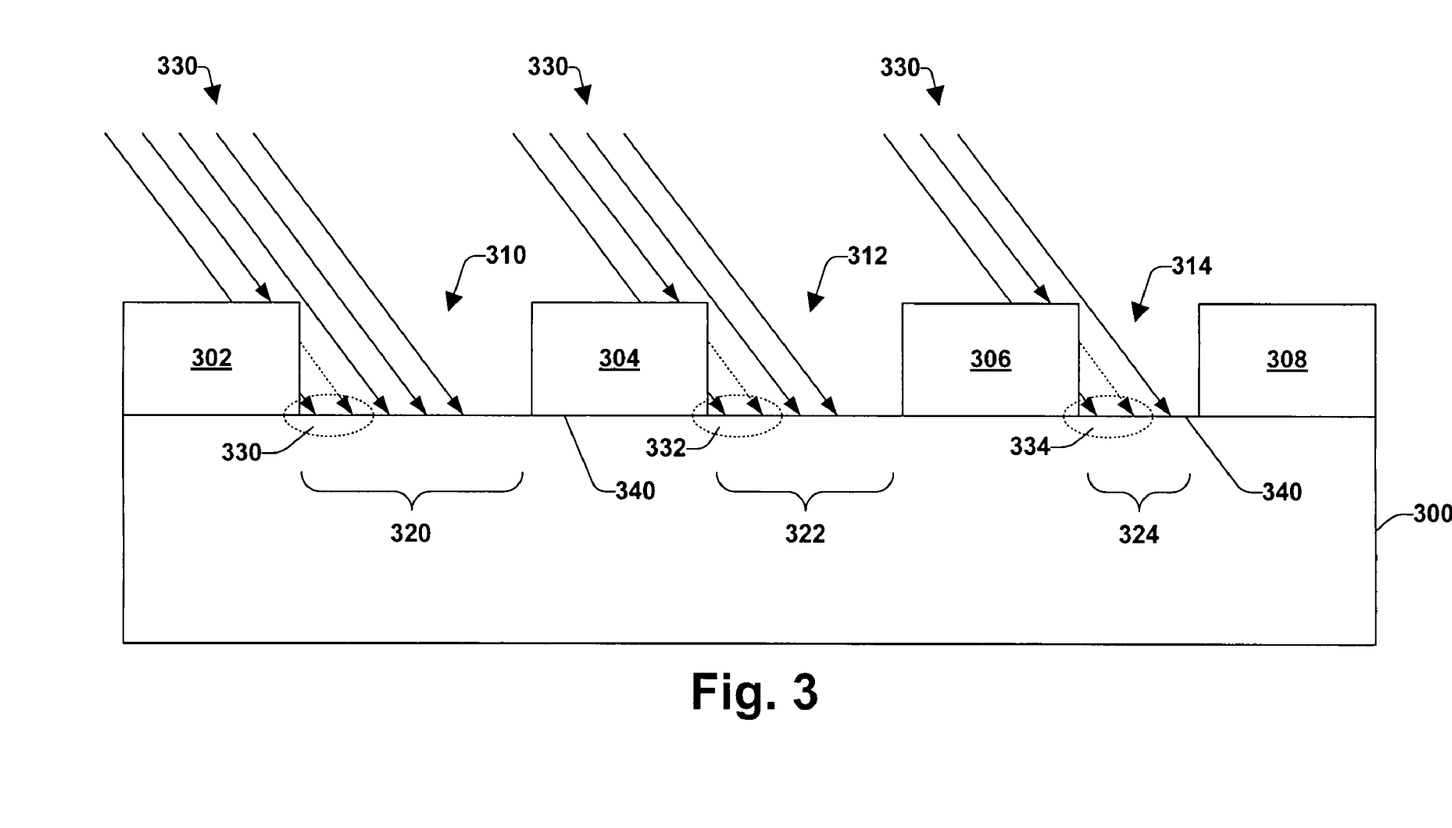
FIG. 3 is a cross-sectional view of a portion of a semiconductor substrate having features formed thereon that are separated by varying distances and that experiences shadowing effects to varying degrees during ion implantation.

Turning to FIG. 3, for example, a cross sectional view of a portion of a semiconductor substrate or wafer 300 has a plurality of features 302, 304, 306, 308 formed thereon, and respective spacings 310, 312, 314 are defined there-between. The features 302, 304, 306, 308 are formed out of a resist material and thus are all of substantially the same height.

Areas 320, 322, 324 of the substrate 300 exposed by the spacings 310, 312, 314 are to be doped via ion implantation. Accordingly, one or more ion beams 330 are directed at the substrate 300 to perform the doping. The beams 330 are, however, oriented at an angle with respect to a surface 340 of the substrate 300 to mitigate channeling effects, for example. Some of the beams 330 thus have some of their ions blocked by portions (e.g., corners) of the features 302, 304, 306, 308. As such, regions 350, 352, 354 within the substrate areas 320, 322, 324 receive less than intended amounts of dopant ions. Such shadowing may leave some regions of the device improperly dosed. Accordingly, adverse effects associated with shadowing can become exaggerated depending upon implantation angles. It can thus be appreciated that it would be desirable to know an implantation orientation to be able to regulate shadowing effects and channeling, for example.

The above discussions of channeling and shadowing serve to make the point that angle control of the ion beam to the wafer surface and crystal planes is important to good process control. It is therefore important that there be a method to measure the angle of the incident ions and that measurement technique should be calibrated, if possible, to the crystal planes of the wafer. It will appreciated that the effect of an implant on the silicon wafer can be measured electrically using a probe that measures resistivity or sheet resistance at many points on the wafer, or through surface photovoltage techniques as provided by Q C Solutions, Inc., Billerica, Mass. Alternatively, it may be measured by an optical modulation technique such as with a Thermo-probe, built by Therma-Wave, Inc. Fremont, Calif. 94539. While each of these may show where the channelling is strongest, the latter measurement technique is particularly sensitive to crystalline damage and is useful to determining where on a wafer ions are moving more nearly parallel to the crystal planes.

Figure 4:
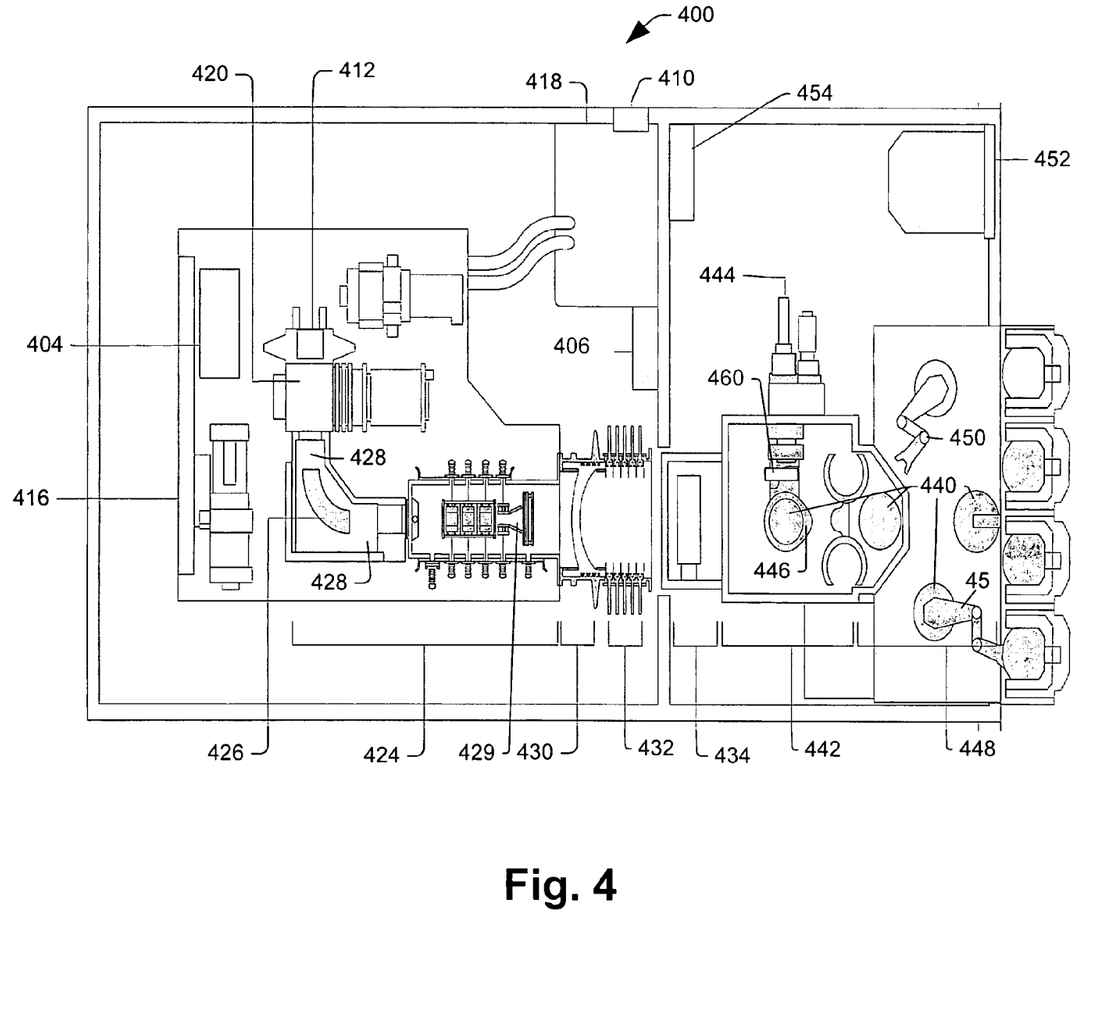
FIG. 4 illustrates an exemplary ion implantation system wherein one or more aspects of the present invention may be implemented.

FIG. 4 illustrates an ion implantation system 400 wherein one or more aspects of the present invention can be implemented. The system 400 includes a modular gas box 404, an auxiliary gas box 406 and a gas box remote purge control panel 410. The gas boxes 404, 406 comprise, among other things, one or more gases of a dopant substance, and the boxes 404, 406 facilitate selective delivery of the gas(es) into an extended life ion source 412 within the system 400, wherein the gas(es) can be ionized to generate ions suitable for implantation into wafers or workpieces selectively brought into the system 400. The gas box remote control panel 410 facilitates venting or purging gas(es) or other substances out of the system 400 on an as needed or desired basis.

High voltage terminal power distribution 416 and a high voltage isolation transformer 418 are included to, among other things, electrically excite and impart energy to the dopant gas(es) to generate ions from the gas(es). An ion beam extraction assembly 420 is included to extract ions from the ion source 412 and accelerate them into a beamline assembly 424, which includes a mass analysis magnet 426. The mass analysis magnet 426 is operable to sort out or reject ions of an inappropriate charge-to-mass ratio. In particular, the mass analysis magnet 426 comprises a beamguide 428 having sidewalls into which ions of an undesired mass-to-charge ratio collide as they are propagated through the beamguide 428 by way of one or more magnetic fields generated by magnet(s) of the mass analysis magnet 426.

A scanner 429 that deflects the beam at small angles left and right allows the beam to span a large diameter target. A scan angle correction lens 430 accelerates the beam by a fixed factor and cancels the divergent component of the velocity, so that ions are moving substantially parallel after this lens. An acceleration/deceleration column 432 may be included to assist with controlling and adjusting the speed, and/or focusing, of ions within the ion beam. A component 434 operable to filter out contaminant particles, such as a final energy filter, may also be included within the system 400.

Wafers or workpieces 440 are loaded into an end station chamber 442 for selective implantation with ions. A mechanical scan drive 444 maneuvers the wafers within the chamber 442 to facilitate selective encounters with the beam(s). The scan drive may, for example, maneuver a workpiece holder 446 that holds one or more wafers 440 (e.g., for serial implants) about one or more axes to facilitate an unlimited number of implantation angles. The wafers or workpieces 440 are moved into the end station chamber 442 by a wafer handling system 448, which may include, for example, one or more mechanical or robotic arms 450.

An operator console 452 allows an operator to regulate the implantation process by selectively controlling one or more components of the system 400. Finally, a power distribution box 454 is included to provide power to the overall system 400. U.S. Pat. No. 4,975,586 to Ray discloses an exemplary end station 442 and components thereof in slightly greater detail, where the end station has a wafer support or holder that is maneuverable about multiple axes. The entirety of this patent is thus hereby fully incorporated by reference.

According to one or more aspects of the present invention, a measurement component 460 is operatively associated with the system 400 to facilitate determining a relative orientation between the ion beam and a workpiece 440 into which the ion beam implants ions. In particular, the measurement component 460 is associated with a component within the end station 442, such as a scan arm upon which the workpiece is affixed for ion implantation. The measurement component 460 is mounted at a known orientation relative to the workpiece so that once an orientation between the beam and the measurement component is established the orientation between the beam and the workpiece can also be established.

Figure 5:
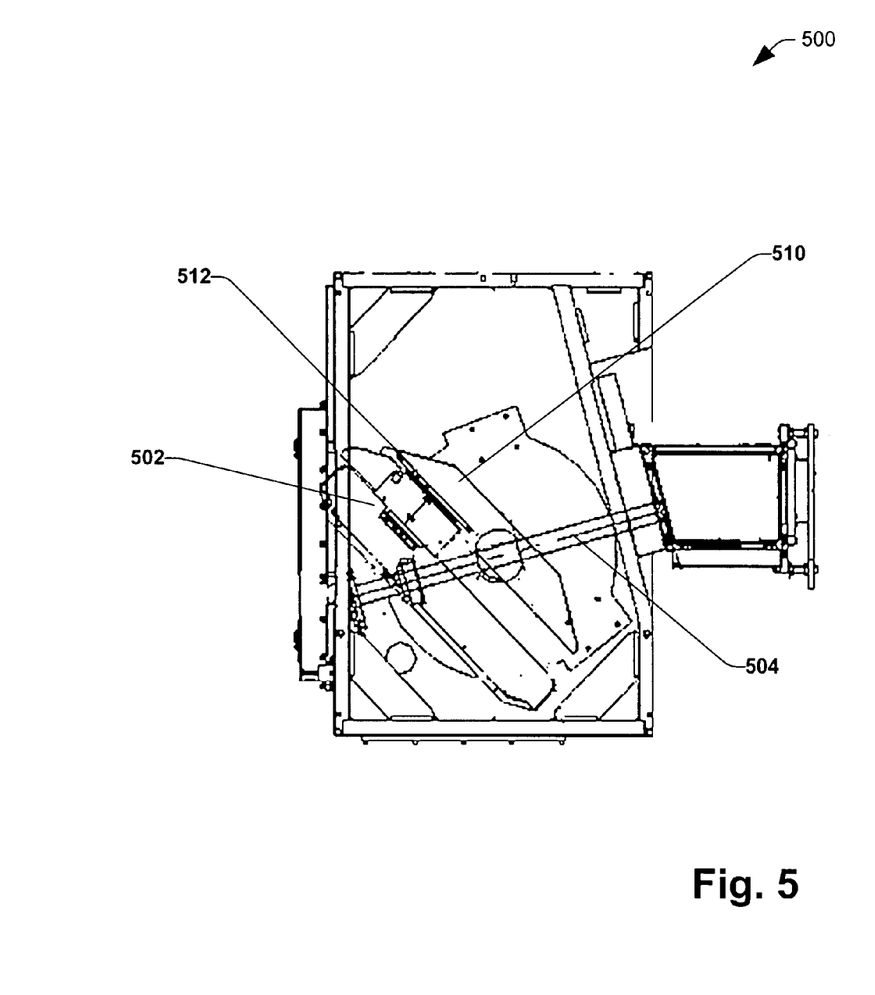
FIG. 5 is a schematic view illustrating an endstation wherein one or more aspects of the present invention may be implemented.
Figure 6:
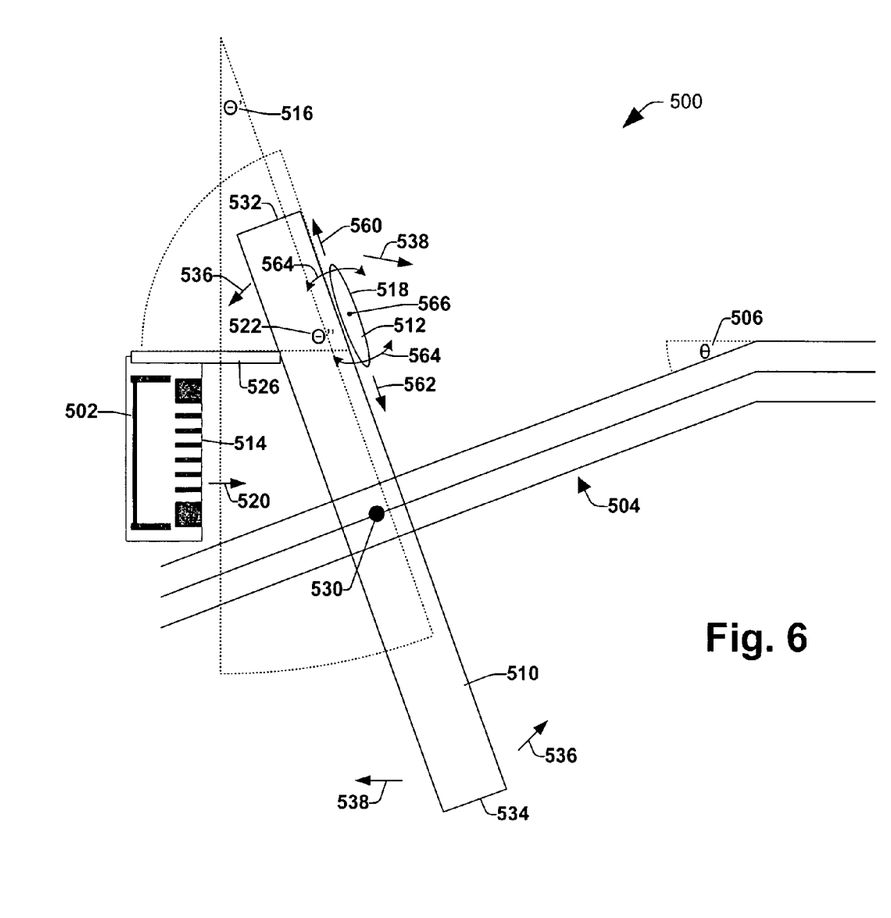
FIG. 6 is a schematic diagram illustrating an endstation such as that depicted in FIG. 5, but where merely more important aspects are illustrated according to one or more aspects of the present invention.
Figure 7:
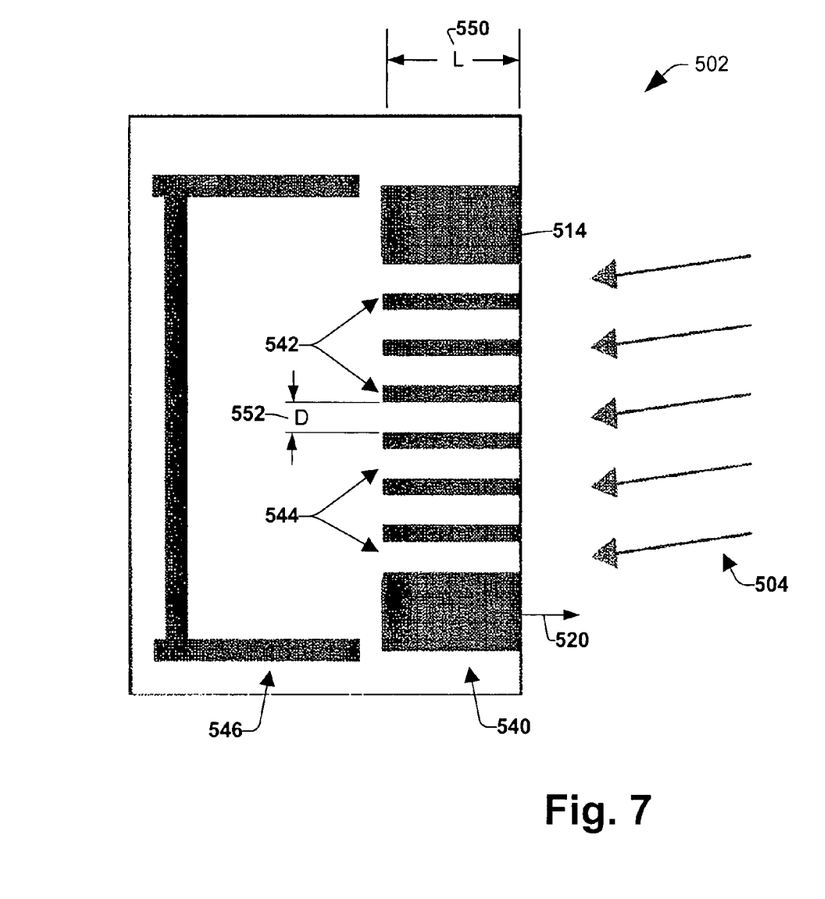
FIG. 7 is a schematic diagram illustrating a measurement component according to one or more aspects of the present invention.

Turning to FIGS. 5, 6 and 7, a more thorough explanation of the operation and configuration of a measurement component according to one or more aspects of the present invention is presented. FIG. 5 is a cross sectional view of an exemplary end station 500 wherein a measurement component 502 can be situated according to one or more aspects of the present invention. FIG. 6 is a similar cross sectional view of an end station 500, but where parts that are more important to one or more aspects of the present invention are merely illustrated. FIG. 7 schematically illustrates an exemplary measurement component 502 that can be mounted within an end station 500 according to one or more aspects of the present invention.

As shown in FIGS. 5 and 6, parallelized ion beams 504 are commonly bent, such as at a vertical bend angle θ 506 of about 15 degrees, for example, before being implanted into a workpiece, particularly where the ion beam is a horizontal ribbon or scanned, ribbon-like beam. The beams can be bent, for example, so that energy contaminants do not impinge upon the workpiece. Electrostatic and/or magnetic techniques are generally employed in bending ion beams. However, the amount that a beam is actually bent may vary slightly from what is intended. Utilizing a measurement component 502 as described herein, however, obviates the effects of these variations by allowing an orientation of the wafer to the beam to be accurately ascertained regardless of the trajectory of the beam 504.

The measurement component 502 is mounted to a component within the end station 500, such as a scanning arm 510 upon which the workpiece 512 resides for ion implantation. In this manner the measurement component 502 is situated at a known orientation relative to the workpiece 512. For example, the surface 514 of the measurement component 502 may be situated at an angle θ' 516 relative to the surface 518 of the workpiece 512. Similarly, the measurement component 502 may be oriented so that a direction 520 normal to the surface 514 of the measurement component 502 is at a known angle θ'' 522 relative to the surface 518 of the workpiece 512. In any event, the orientation of the measurement component 502 to the workpiece 512 is known so that the orientation of the beam 504 to the workpiece 512 can be determined once the orientation of the beam 504 to the measurement component 502 is determined.

It will be appreciated that the measurement component 502 is sufficiently attached so that its orientation to the workpiece 512 does not change, particularly as the scan arm 510, workpiece 512 and/or measurement component 502 are maneuvered. The measurement component 502 may, for example, be mounted with one or more rigid bracket 526 to the scan arm 510. The orientation of the measurement component 502 to the workpiece 512 may, however, be adjustable, such as by loosening a screw, nut, bolt or other clamping mechanism (not shown) and then re-securing the same once the measurement component 502 has been adjusted.

To determine the orientation of the measurement component 502 to the beam 504, the measurement component 502 is maneuvered relative to the beam, such as by pivoting the scan arm 510 to which the measurement component 502 is attached about a horizontal axis 530. This causes upper 532 and lower 534 ends of the arm to rock back and forth or tilt in opposing directions 536 and 538, and also causes the measurement component 502 to pass through the ion beam 504 since the measuring component 502 is fixedly attached to the scan arm 510. The measurement component 502 is sensitive to ion radiation and detects various amounts of ion radiation depending upon the orientation between the beam and the measurement component.

As can be seen in FIG. 7, the measurement component 502 comprises a mask 540 which may be formed out of graphite, for example, and comprises a plurality of tines 542 spaced apart by slots 544. An ion sensitive portion 546, such as may comprise a Faraday cup, for example, is situated behind or downstream of the mask 540. The tines 542 have a length L 550 and the are separated by a distance D 552 such that when the ion beam 504 is not co-axial with the slots 544 or normal 520 to the surface 514 of the measurement component 502, then some of the beam is blocked by the tines 542 and does not reach the radiation sensitive portion 546 of the measurement component 502. In one example, the tines 542 have a length L 550 of between about 5 and 50 millimeters and the slots 544 separate the tines 542 by a distance D 552 of between about 1 and 15 millimeters.

The radiation sensitive portion 546 of the measurement component 502 can output a current indicative of the amount of ion beam impinging thereon. Accordingly, since varying amounts of the ion beam 504 are allowed to pass through the mask 540 depending upon the relative orientation between the mask 540 and the (stationary) ion beam 504, the current output by the measurement component 502, and more particularly the radiation sensitive component 546, varies as a function of the alignment of the beam 504 to the measurement component 502 (e.g., the beam angle). A peak current is thus indicative of the beam being aligned with the mask 540, or rather parallel to the normal 520 of the measurement component 502. Since the orientation (angle) of the measurement component 502 to the workpiece 512 is known, the orientation of the beam 504 to the workpiece 512 can be readily determined, such as by merely adding or subtracting an offset angle θ', for example. It will be appreciated that center of mass calculations and/or curve fitting can also be implemented where multiple current readings are taken while moving the measurement component 502 through the beam 504 to determine when beam is directly impinging upon measurement component 502.

With a known orientation of the beam 504 to the workpiece 512, the workpiece 512 can be adjusted to achieve desired doping, such as in light of channeling and/or shading considerations, for example. The workpiece 512 may, for example, be able to slide up 560 and down 562 the scan arm 510 and/or be able to pivot or tilt about a horizontal axis in directions 536 and 538 about an axial point 530 so as to desirably align the workpiece with beam 504 and/or to achieve one or more desired implantation angles for selective ion implantation into various locations on the workpiece 512. Additionally, the workpiece may be "twisted" about an axis normal to the surface at the center 566 of the workpiece in order to achieve the desired orientation of the workpiece relative to the ion beam. It will be appreciated that such movements of the workpiece 512 can generally be performed precisely with finely tuned mechanics.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" as utilized herein simply means example.

What is claimed is:

1. A device that assists with ion implantation, comprising:
   a measurement component operatively associated with an endstation that is configured to position a workpiece relative to an ion beam so that ions traveling in the ion beam impact the workpiece at select locations, where the measurement component facilitates determining a relative orientation between the ion beam and the workpiece, the measurement component rigidly attached to a component of the endstation upon which the workpiece resides during implantation such that a surface of the measurement component or a direction normal thereto is situated at a known angle relative to the surface of the workpiece.

2. The device of claim 1, where the measurement component comprises:
   a mask that allows varying amounts of the ion beam to pass therethrough depending upon the relative orientation between the mask and the ion beam; and
   an ion sensitive portion situated behind the mask whereon the varying amounts of the ion beam impinge after passing through the mask.

3. The device of claim 2, where the mask comprises:
a plurality of tines separated by respective slots that allow varying amounts of the ion beam to pass therethrough depending upon the relative orientation between the tines and the ion beam.

4. The device of claim 2, where the ion beam is a horizontal ribbon or scanned, ribbon-like beam, where the device is used to measure a vertical bend angle of the ribbon.

5. The device of claim 4, where at least one of
the slots separate the tines by between about 1 and 10 millimeters, and
the tines have a length of between about 5 and 50 millimeters.

6. The device of claim 4, where at least one of:
the device facilitates tilting the workpiece about a horizontal axis to establish a desired orientation of the workpiece to the vertically bent ribbon-like ion beam based upon a known relationship of the measurement component to the workpiece,
the device facilitates twisting the workpiece about an axis normal to the surface of the workpiece at its center to additionally establish a desired orientation of the workpiece to the vertically bent ribbon-like ion beam, and
the device facilitates adjusting the vertical bend angle of the ribbon-like beam to establish a desired orientation of the workpiece to the ion beam based upon a known relationship of the measurement component to the workpiece.

7. The device of claim 5, where at least one of:
the device facilitates tilting the workpiece about a horizontal axis to establish a desired orientation of the workpiece to the vertically bent ribbon-like ion beam based upon a known relationship of the measurement component to the workpiece,
the device facilitates twisting the workpiece about an axis normal to the surface of the workpiece at its center to additionally establish a desired orientation of the workpiece to the vertically bent ribbon-like ion beam, and
the device facilitates adjusting the vertical bend angle of the ribbon-like beam to establish a desired orientation of the workpiece to the ion beam based upon a known relationship of the measurement component to the workpiece.

8. An ion implantation system comprising:
an ion source for generating ions;
a beamline assembly for generating an ion beam from the ions generated by the ion source and directing the ions along a path of travel;
an endstation for positioning a workpiece relative to the path of travel so that ions traveling in the ion beam impact the workpiece at select locations; and
a measurement component rigidly attached to a component of the endstation upon which the workpiece resides during implantation such that a surface of the measurement component or a direction normal thereto is situated at a known angle relative to the surface of the workpiece, where the ion beam impinges on the measurement component when the endstation component is moved.

9. The system of claim 8, where the measurement component measures the intensity of the ion beam impinging thereon as a function of the orientation of the beam to the measurement component so that a particular orientation between the measurement component and the ion beam can be established by moving the measurement tool relative to the impinging beam.

10. The system of claim 8, where the measurement component comprises: a mask that allows varying amounts of the ion beam to pass therethrough depending upon the relative orientation between the mask and the ion beam; and an ion sensitive portion situated behind the mask whereon the varying amounts of the ion beam impinge after passing through the mask.

11. The system of claim 10, where the mask comprises:
a plurality of tines separated by respective slots that allow varying amounts of the ion beam to pass therethrough depending upon the relative orientation between the tines and the ion beam.

12. The system of claim 11, where the ion sensitive portion outputs a current indicative of the amount of ion beam impinging thereon.

13. The system of claim 12, where at least one of
the tines comprise graphite,
the slots separate the tines by between about 1 and 10 millimeters, and
the tines have a length of between about 5 and 50 millimeters.

14. The system of claim 9, where at least one of:
the workpiece is tilted about a horizontal axis to establish a desired orientation of the workpiece to the vertically bent ribbon-like ion beam based upon a known relationship of the measurement component to the workpiece,
the workpiece is twisted about an axis to additionally establish a desired orientation of the workpiece to the vertically bent ribbon-like ion beam, and
the vertical bend angle of the ribbon-like ion beam is adjusted to establish a desired orientation of the workpiece to the ion beam based upon a known relationship of the measurement component to the workpiece.

15. A method of establishing a relative orientation between an ion beam and a workpiece into which ions are to be implanted by the beam to facilitate more accurate doping of the workpiece, comprising:
directing the beam at a measurement component rigidly attached to a component upon which the workpiece resides during implantation, a surface of the measurement component or a direction normal thereto situated at a known angle relative to the surface of the workpiece;
moving the measurement component until the ion beam impinges thereon; and
establishing a relative orientation between the ion beam and the workpiece based upon the known angle and when the ion beam impinges upon the measurement component.

16. The method of claim 15, further comprising:
orienting the workpiece to the ion beam given the known relationship between the workpiece and the measurement component.

17. The method of claim 16, further comprising:
orienting the workpiece to the ion beam by at least one of:
tilting the workpiece about a horizontal axis,
twisting the workpiece about a vertical axis, and
adjusting a vertical bend angle of the ion beam.

18. The method of claim 17, further comprising:
setting a zero angle of an ion implantation system where the beam directly impinges upon the workpiece.

* * * * *